(12) United States Patent
Ferguson et al.

(10) Patent No.: US 7,574,642 B2
(45) Date of Patent: Aug. 11, 2009

(54) MULTIPLE USES FOR BIST TEST LATCHES

(75) Inventors: Steven Ross Ferguson, Granite Shoals, TX (US); Garrett Stephen Koch, Cambridge, VT (US); Osamu Takahashi, Round Rock, TX (US); Michael Brian White, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 11/101,615

(22) Filed: Apr. 7, 2005

(65) Prior Publication Data

US 2006/0242519 A1 Oct. 26, 2006

(51) Int. Cl.
*G01R 31/28* (2006.01)
(52) U.S. Cl. .................. 714/733; 714/726; 714/729
(58) Field of Classification Search .......... 714/100–824
See application file for complete search history.

(56) References Cited

U.S. PATENT DOCUMENTS

| | | | | |
|---|---|---|---|---|
| 5,960,008 A | * | 9/1999 | Osawa et al. .................. 714/726 |
| 5,961,653 A | * | 10/1999 | Kalter et al. .................... 714/7 |
| 6,829,728 B2 | * | 12/2004 | Cheng et al. .................... 714/30 |
| 6,971,054 B2 | * | 11/2005 | Kurtulik et al. ............. 714/732 |
| 7,146,547 B2 | * | 12/2006 | Fukatsu ....................... 714/718 |
| 2003/0110431 A1 | * | 6/2003 | Davies et al. ................ 714/726 |
| 2005/0063211 A1 | * | 3/2005 | Atallah et al. ................ 365/145 |
| 2006/0012392 A1 | * | 1/2006 | Rencher et al. ................ 326/16 |
| 2006/0176745 A1 | * | 8/2006 | Eustis et al. ................. 365/201 |

* cited by examiner

*Primary Examiner*—Cynthia Britt
*Assistant Examiner*—Guerrier Merant
(74) *Attorney, Agent, or Firm*—Carr LLP; Matt Talpis

(57) ABSTRACT

A method is provided to utilize built-in self test (BIST) latches for multiple purposes. Conventionally, BIST latches are single purpose. Hence, separate latches are utilized for array built-in self test (ABIST) and logic built-in self test (LBIST) operations. By having the separate latches, though, a substantial amount area is lost. Therefore, to better utilize the latches and the area, ABIST latches are reconfigured to utilize some previously unused ports to allow for multiple uses for the latches, such as for LBIST.

6 Claims, 3 Drawing Sheets

MULTIPLE USES FOR BIST TEST LATCHES

FIELD OF THE INVENTION

The present invention relates generally to testing circuitry, and more particularly, to on-chip built-in test circuitry.

DESCRIPTION OF THE RELATED ART

During the manufacture of semiconductors on wafers, an important aspect of the manufacturing process is to test the circuitry to determine if the configuration is correct. In order to determine if the circuitry is correct, certain test circuitry is employed. The test circuitry determines if there were any errors or anomalies during manufacturing.

Typically test patterns are input into the circuits on the wafers. If the configuration is correct, then specific output patterns will be produced. Otherwise the output patterns will be inconsistent with predetermined output patterns to indicate errors. The output patterns can also be used to extrapolate potential problems for future usage or continual problems in the manufacturing process.

Testing the on-chip circuitry, however, requires testing of multiple aspects of the circuitry. Testing of array macros can be performed by Array Built-In Self Test (ABIST) circuitry. ABIST circuitry is additional on-chip circuitry that is coupled to an ABIST test engine that allows for screening of mature technology. Additionally, the ABIST test engines have contingency protocols for early hardware screening and failure analysis.

Test engines, such as the ABIST test engines, however, do not typically provide a full complement of analyses for all of the circuitry. Therefore, logic contained with an array macro may not be fully tested by on-chip test circuitry and the associated test engines. To combat the lack of analysis for logic within the array macro, Logic Built-In Self Tests (LBISTs) are employed to increase coverage of the logic within the array macro. To function, however, LBIST results are captured into scannable latches to verify correct behavior.

Adding more latches to perform such task, though, is not a viable option. Additional observation latches leads to many other problems. For example, size, timing, and area of a macro can be severely impacted.

Therefore, there is a need for a method and/or apparatus that both 1) fully tests an array macro without adversely affecting the array macro and 2) addresses at least some of the problems associated with conventional testing methods and/or apparatuses.

SUMMARY OF THE INVENTION

The present invention provides a method for efficient multipurpose use of built-in self test (BIST) test latches in testing arrays of a processor. At least two different modes can be employed with the BIST latches. For a first mode, the latches are configured to operate as array built-in self test (ABIST) shadow latches to test the arrays. Then for a second mode, the latches are reconfigured to operate as logic built-in self test (LBIST) observation latches to test the arrays.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
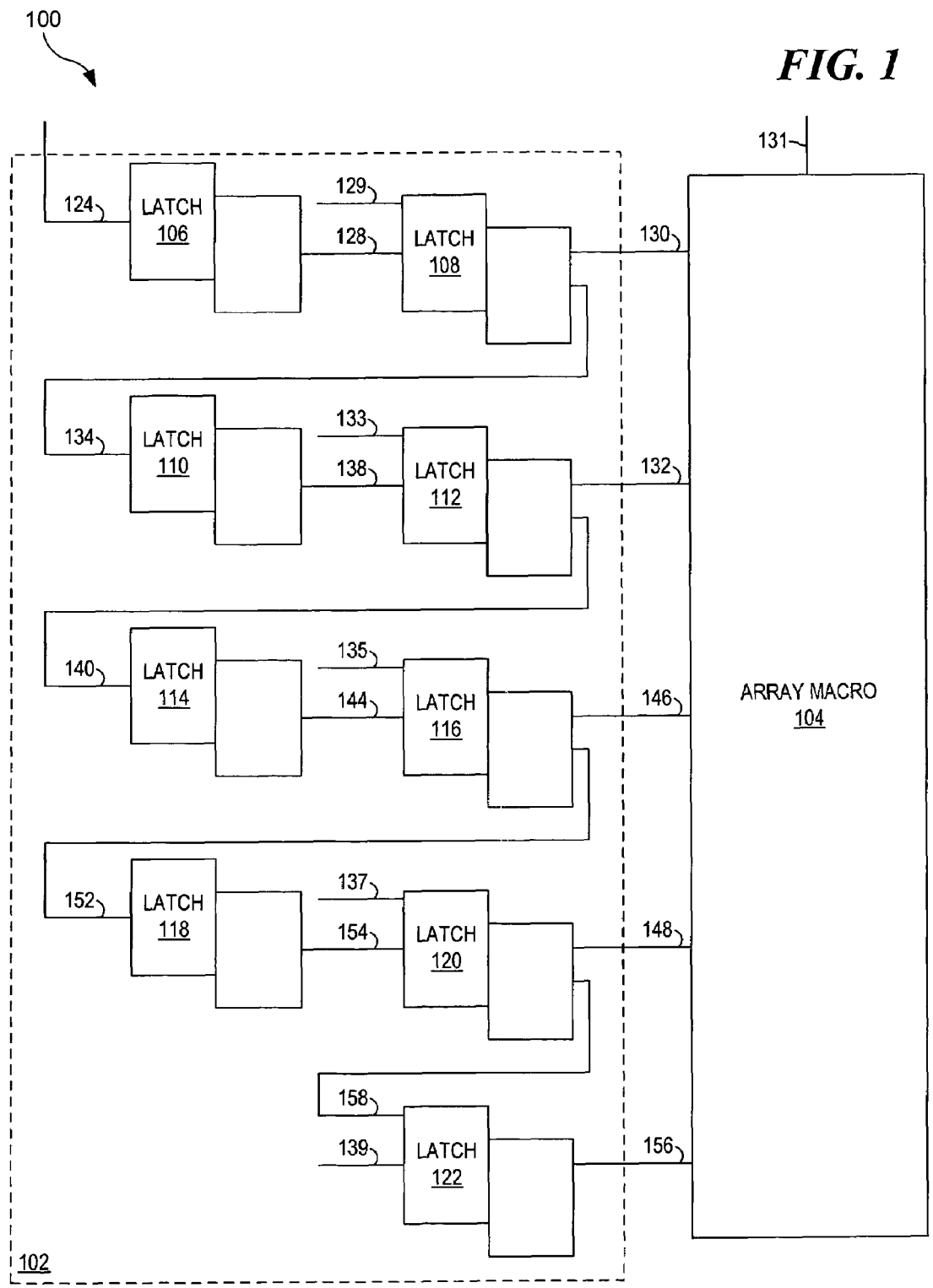
FIG. 1 is a block diagram depicting a macro.
Figure 2:
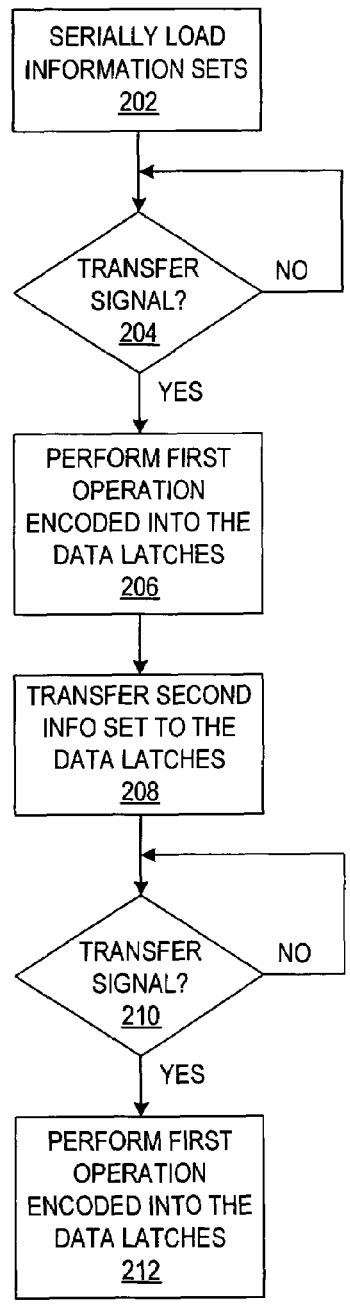
FIG. 2 is a flow chart depicting the operation of the macro.

Referring to FIGS. 1 and 2 of the drawings, the reference numerals 100 and 200 generally designates a macro and a method of operation, respectively. An ABIST engine (not shown) provides test patterns and receives results from the macro 100 for a specific type of logic system, such as data or instruction logic. In order to more completely test the macro 100, the ABIST engine (not shown) utilizes back-to-back sequential array accesses. For example, the ABIST engine (not shown) performs back-to-back write-write, write-read, read-write, or read-read accesses to different locations. To receive signals from the ABIST engine (not shown) and transmit results, the macro 100 comprises an array macro 104 and test logic 102. Additionally, the test logic 102 further comprises latches 106, 108, 110, 112, 114, 116, 118, 120, and 122. The latches 106, 110, 114, and 118 are also commonly referred to as shadow latches that operate as scan latches.

The shadow latches 106, 110, 114, and 118 are scan latches because they are not in the normal functional path of the macro 100. Specifically, the shadow latches 106, 110, 114, and 118 are utilized to hold a second ABIST instruction. The ABIST engine (not shown) could function without the scan latches 106, 110, 114, and 118; however, without the scan latches 106, 110, 114, and 118, the ABIST engine (not shown) would need to understand the logic in multiple latch stages. Additionally, the ABIST engine (not shown) would have to contend with any logic between the stages. Hence, depending on the logic the ABIST engine (not shown) may not have complete control.

The test logic 102 provides test signals to the array macro 104 and receives output data from the array macro 104. Specifically, the ABIST engine (not shown) transmits a data stream through the scan paths of the shadow latches 106, 110, 114, and 118 and of the data latches 108, 112, 116, 120, and 122. Data is continually scanned through the latches 106, 108, 110, 112, 114, 116, 118, 120, and 122. Specifically, the data from the ABIST engine (not shown) scans thru the latches in the following order: 106 to 108 to 110 to 112 to 114 to 116 to 118 to 120 to 122. Information can also be loaded into the data latches 108, 112, 116, 120, and 122 through the communication channels 129, 133, 135, 137, and 139, respectively depending on the mode in which the latches 108, 112, 116, 120, and 122 are functioning.

To initiate a testing procedure, scan-in signals are transmitted from an ABIST engine (not shown) to the latch 106 through a communication channel 124. Data that corresponds to two information sets are serially loaded into each of the shadow latches 106, 110, 114, and 118 and the data latches 108, 112, 116, 120 and 122 in step 202 of FIG. 2. The sets of information can comprise a variety of types of information, such as addresses, data, and so forth. During this cycle, the data latches 108, 112, 116, 120 and 122 receive the correct data for the first back-to-back operation, and shadow latches 106, 110, 114, and 118 receive the correct data for the second back-to-back operation.

In order for data to propagate through the scan paths, interconnections between the shadow latches 106, 110, 114, and 118 and the data latches 108, 112, 116, 120, and 122 are employed. The shadow latches 106, 110, 114, are 118 can transmit information to the remaining latches 108, 112, 116, and 120 through the communication channel 128, 138, 144, and 154, respectively. Additionally, latch 108 feeds back information to the latch 110 through the communication channel 134. The latch 112 feeds back information to the latch 114 through the communication channel 140. The latch 116 feeds back information to the latch 118 through the communication channel 152, and latch 120 transmits data to latch 122 through the communication channel 158. Therefore, information can be serially, and otherwise, loaded into the latches 106, 108, 110, 112, 114, 116, 118, 120, and 122.

Each time information is propagated along the scan paths, precise timing is needed. A trigger signal is transmitted to the array macro 104 from the ABIST generator (not shown) through the communication channel 131 in step 204 of FIG. 2. The trigger signal is sent to the array macro 104 to perform the first operation encoded in data latches 108, 112, 116, 120 and 122 in step 206 of FIG. 2. The second set is then transferred from the shadow latches 106, 110, 114, and 118 to the data latches 108, 112, 116, 120, and 122 in step 208 of FIG. 2. A second trigger signal is then transmitted, in step 210 of FIG. 2, to array macro 104 through the communication channel 131. When triggered, the data latches 108, 112, 116, 120, and 122 can perform the second encoded operation to the array macro 104 in step 212 of FIG. 2 through the communication channel 130, 132, 146, 148, and 156, respectively.

The data acquisition for the ABIST generator (not shown), however, is accomplished by analysis of the output latches (not shown).

The latches acquire data solely through scan input/output pins without any connection to the data. Therefore, the latches are precluded from LBIST observations.

Figure 3:
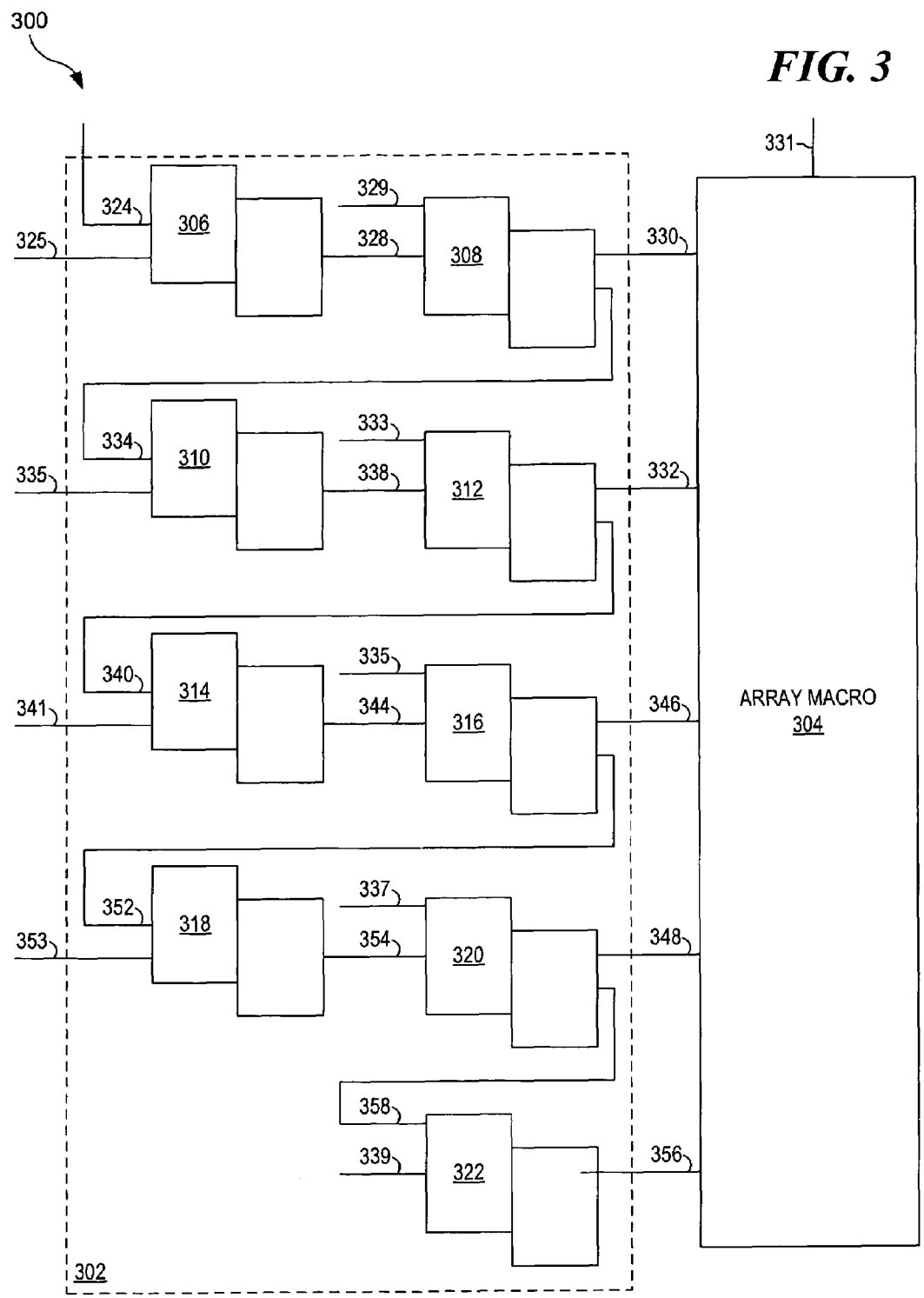
FIG. 3 is a block diagram depicting a modified macro.

Since the operation of the latches precludes LBIST observations, additional changes are required to better utilize the existing hardware for additional analyses. Referring to FIG. 3 of the drawing, the reference numeral 300 generally designates a rewired macro. An ABIST engine (not shown) provides test patterns and receives results from the macro 300 for a specific type of logic system, such as data or instruction logic. In order to more completely test the macro 300, the ABIST engine (not shown) utilizes back-to-back sequential array accesses. For example, the ABIST engine (not shown) performs back-to-back write-write, write-read, read-write, or read-read accesses to different array address locations.

To receive signals from the ABIST engine (not shown) and transmit results, the macro comprises an array macro 304 and test logic 302.

Additionally, the test logic 302 further comprises latches 306, 308, 310, 312, 314, 316, 318, 320, and 322. The latches 306, 310, 314, and 318 are also commonly referred to as shadow latches that operate as scan latches.

The shadow latches 306, 310, 314, and 318 are scan latches because they are not in the normal functional path of the macro 300. Specifically, the shadow latches 306, 310, 314, and 318 are utilized to hold a second ABIST instruction. The ABIST engine (not shown) could function without the scan latches 306, 310, 314, and 318; however, without the scan latches 306, 310, 314, and 318, the ABIST engine (not shown) would need to understand the logic in multiple latch stages. Additionally, the ABIST engine (not shown) would have to contend with any logic between the stages. Hence, depending on the logic the ABIST engine (not shown) may not have complete control.

The difference between the macro 100 and the macro 300 is the ability to capture LBIST info on the data input path of the shadow latches 306, 310, 314, and 318. Even though the functionality of the macro 300 is similar to the functionality of the macro 100, the shadow latches do not only "shadow" in an ABIST mode, but instead, can actively observe the data in an LBIST mode. Enablement of the observation feature in an LBIST mode is accomplished through the use of communication channels 325, 335, 341 and 353 that enables the shadow latches 306, 310, 314, and 318 are capturing data for the LBIST controlled Multiple Input Shift Register (MISR).

Both ABIST and LBIST work by placing data patterns in scannable latches, clocking a number of times, and capturing the output in scannable latches. In an example macro containing a sum-addressed array, both the sum-address circuitry and the array internals need to be verified. If there are loose enough timing constraints, scannable latches would be placed between the sum-address circuitry and the array, enabling easy verification through ABIST and LBIST. ABIST tests the internal array structure and searches for circuit errors and ensures every bit can hold all possible values without interference from surrounding data. LBIST tests logic circuits and can use the understanding that multiple patterns can produce similar results to reduce its test size.

However, if timing between the sum-address circuitry and the array is critical, ABIST and LBIST regions overlap while still providing scannable latches to capture the data. An ABIST engine (not shown) cannot easily handle the multiple overlapping addresses possible to calculate with a sum-address circuit. The ABIST engine (not shown) can control one of the addresses while holding the other address to zero. Thus, while the sum-address circuitry is within the ABIST region, the sum-address circuitry is not being tested. Hence, an ABIST engine (not shown) is utilized to test the sum-address circuitry.

In previous designs, the sum-address circuit outputs would be split into two paths. The first path goes directly to the array inputs, while the second path goes to scannable "observation" latches used only to capture the output for LBIST coverage purposes. These observation latches require area and power, while providing no benefit during normal chip operation. Since the shadow latches 306, 310, 314, and 318 hold the second ABIST operation and have both data and scan inputs, an array macro 304, such as sum-address circuitry, output signals are connected to the shadow latch data inputs 325; 326, 341, and 353. Previously, the data inputs 325, 326, 341, and 353 were unused and tied to ground.

During operation, macro 304 can be enabled to operate in three modes: functional, ABIST, or LBIST. During the functional mode, the test circuit 302 is set up to operate normally where data, control, and address information are loaded into the latches 308, 312, 316, 320, and 322 in parallel paths 329, 333, 335, 337 and 339. In an ABIST mode, macro 302 operates in scan mode where the data is transferred into latches 308, 312, 316, 320, and 322 serially along with the second operation in latches 306, 310, 314, and 318. However, LBIST mode utilizes the shadow latches 306, 310, 314, and 318 to make observations, utilizing previously unused data ports 324, 334, 340, and 352 on the shadow latches 306, 310, 314, and 318.

Specifically, during an ABIST mode, the test logic 302 provides test signals to the array macro 304 and receives output data from the array macro 304. Specifically, the ABIST engine (not shown) transmits a data stream through the scan paths of the shadow latches 306, 310, 314, and 318 and of the data latches 308, 312, 316, 320, and 322. Data is continually scanned through the latches 306, 308, 310, 312, 314, 316, 318, 320, and 322. Specifically, the data from the ABIST engine (not shown) scans thru the latches in the following order: 306 to 308 to 310 to 312 to 314 to 316 to 318 to 320 to 322. Information can also be loaded into the data latches 308, 312, 316, 320, and 322 through the communication channels 329, 333, 335, 337, and 339, respectively depending on the mode in which the latches 308, 312, 316, 320, and 322 are functioning.

To initiate a testing procedure, scan-in signals are transmitted from an ABIST engine (not shown) to the latch 306 through a communication channel 324. Data that corresponds to two information sets are serially loaded into each of the shadow latches 306, 310, 314, and 318 and the data latches 308, 312, 316, 320 and 322. The sets of information can comprise a variety of types of information, such as addresses, data, and so forth. During this cycle, the data latches 308, 312, 316, 320 and 322 receive the correct data for the first back-to-back operation, and shadow latches 306, 310, 314, and 318 receive the correct data for the second back-to-back operation.

In order for data to propagate through the scan paths, interconnections between the shadow latches 306, 310, 314, and 318 and the data latches 308, 312, 316, 320, and 322 are employed. The shadow latches 306, 310, 314, are 318 can transmit information to the remaining latch 308, 312, 316, and 320 through the communication channels 328, 338, 344, and 354, respectively. Additionally, latch 308 feeds back information to the latch 310 through the communication channel 334. The latch 312 feeds back information to the latch 314 through the communication channel 340. The latch 316 feeds back information to the latch 318 through the communication channel 352, and latch 320 transmits data to latch 322 through the communication channel 358. Therefore, information can be serially, and otherwise, loaded into the latches 306, 308, 310, 312, 314, 316, 318, 320, and 322.

Each time information is propagated along the scan paths, precise timing is needed. A trigger signal is transmitted to the array macro 304 from the ABIST generator (not shown) through the communication channel 331. The trigger signal is sent to the array macro 304 to perform the first operation encoded in data latches 308, 312, 316, 320 and 322. The second set is then transferred from the shadow latches 306, 310, 314, and 318 to the data latches 308, 312, 316, 320, and 322. A second trigger signal is then transmitted to array macro 304 through the communication channel 331. When triggered, the data latches 308, 312, 316, 320, and 322 can perform the second encoded operation to the array macro 304 through the communication channels 330, 332, 346, 348, and 356, respectively.

Therefore, the testability of a circuitry can be increased. Latches are reused to allow for elimination of LBIST-only observation latches. The resultant increase in testability, however, is accomplished without additional latches or hardware. Instead, existing hardware is reused. Thus, the flexibility, efficiency, and quality of macros can be increased.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for efficient multipurpose use of built-in self test (BIST) test latches in testing arrays of a processor, comprising:

configuring a first plurality of latches to operate as array built-in self test (ABIST) shadow latches to test the arrays;

reconfiguring the first plurality of latches to operate as logic built-in self test (LBIST) observation latches to test the arrays; and wherein the step of configuring further comprises:

serially loading a first data set into a plurality of data latches coupled in parallel to the first plurality of latches;

wherein the plurality of data latches and the first plurality of latches are further coupled to form a scan chain of alternating latches from the plurality of data latches and the first plurality of latches;

serially loading a second data set into the first plurality of latches operating as ABIST shadow latches; and performing back-to-back operations corresponding to the first and second data set, wherein the first plurality of latches shadows the plurality of data latches.

2. The method of claim 1, wherein the method further comprises capturing data during an ABIST sequence when the plurality of latches operate as ABIST shadow latches.

3. The method of claim 1, wherein the method further comprises capturing data during an LBIST sequence when the plurality of latches operate as LBIST observation latches.

4. The method of claim 1, wherein the step of reconfiguring further comprises:

loading a second data set into the first plurality of latches operating as LBIST observation latches; and directly observing by the plurality of latches.

5. The method of claim 1, wherein the step of configuring further comprises:

transmitting an ABIST signal to the first plurality of latches; and leaving at least one data port in each latch of the plurality of latches as unused.

6. The method of claim 1, wherein the step of reconfiguring further comprises:

transmitting an LBIST signal to the first plurality of latches; and employing at least one data port in each latch of the first plurality of latches that is unused during an ABIST mode.

* * * * *